(12) United States Patent
Attenborough et al.

(10) Patent No.: US 6,721,141 B1
(45) Date of Patent: Apr. 13, 2004

(54) SPIN-VALVE STRUCTURE AND METHOD FOR MAKING SPIN-VALVE STRUCTURES

(75) Inventors: Karen Attenborough, Leuven (BE); Hans Boeve, Wervik (BE); Jo De Boeck, Sint-Katelijne Waver (BE); Jean-Pierre Celis, Kessel-Lo (BE)

(73) Assignees: Interuniversitair Microelektronica Centrum (IMECVZW), Leuven (BE); Katholieke Universiteit Leuven Research & Development, Leuven (BE)

(*) Notice: Subject to any disclaimer, the term of this patent is extended or adjusted under 35 U.S.C. 154(b) by 0 days.

(21) Appl. No.: 09/351,419

(22) Filed: Jul. 9, 1999

(30) Foreign Application Priority Data

Jul. 10, 1998 (EP) .......................................... 988701603

(51) Int. Cl.$^7$ ............................................. G11B 5/127
(52) U.S. Cl. ....................................................... 360/324
(58) Field of Search ............................. 360/324, 324.1, 360/324.11, 324.12, 324.2; 338/32 R, 32 H; 324/207.21, 252

(56) References Cited

FOREIGN PATENT DOCUMENTS

WO    WO 98/14793    4/1998

OTHER PUBLICATIONS

Hart, R and Schwarzacher, W., Magnetoresistance in Ni–Co–Cu/Cu Multilayers Electrodeposited onto (100) n–type Gallium Arsenide Substrates. 1046b Extended Abstracts. Fall Meeting Oct. 10/14, (1993), New Orleans, 93/2 Pennington, NJ, US. pp. 406–407.

van den Berg, H.A.M., et al., GMR Sensor Scheme with Artificial Antiferromagnetic Subsystem. *IEEE Transactions on Magnetics*. 32: 4624–4626 (Sep. 1996).

Schwarzacher, W., and Lashmore, D. S., Giant Magnetoresistance in Electrodeposited Films. *IEEE Transactions on Magnetics*. 32: 3133–3153 (Jul. 1996).

Routkevitch, D., et al., Nonlithographic Nano–Wire Arrays: Fabrication, Physics, and Device Applications. *IEEE Transactions on Electron Devices*. 43: 1646–1658 (Oct. 1996).

Chassaing, E. et al., Nanometric Cu–Co Multilayers Electrodeposited on Indium–Tin Oxide Glass. *Journal of the Electrochemical Society*. 146: 1794–1797 (1999).

European Search Report for Application No. 98870160.3–2208– dated Jan. 15, 1999.

Leal, J.L. and Kryder, M. H., Spin valves exchange biased by Co/Ru/Co synthetic antiferromagnets, Journal of Applied Physics, vol. 83, No. 7, dated Apr. 1, 1998, pp. 3720–3723.

R. Hart, M. Alper, K. Attenborough, W. Schwarzacher, "Giant Magnetoresistance in Ni–Co–Cu/Cu Superlattices Electrodeposited on N–Type (100) GaAs Substrates", Proc. of the 3$^{rd}$ Int. Sym. on Magnetic Materials, Processes and Devices (New Orleans) 94, 215–221, 1993, Electrochemical Society.

S.K.J. Lenczowski, C. Schönenberger, M.A.M. Gijs, and W.J.M. de Jonge, "Giant Magnetoresistance of Electrodeposited Co/Cu Multilayers", Jmmm 148, (1995) 1–10.

J.C.S. Kools, "Exchange–Biased Spin–Valves for Magnetic Storage", IEEE Transactions on Magnetics, vol. 32, No. 4., Jul. 4, 1996, pp. 3165–3184.

*Primary Examiner*—George J. Letscher
(74) *Attorney, Agent, or Firm*—McDonnell Boehnen Hulbert & Berghoff

(57) ABSTRACT

The present invention concerns in a first aspect a spin-valve structure having a first and a second free ferromagnetic layer and a spacer layer positioned between the first and second free ferromagnetic layer, and wherein the first free ferromagnetic layer is positioned on a substrate. In a preferred embodiment of the invention, the first free ferromagnetic layer is in direct contact with the surface of the substrate.

34 Claims, 4 Drawing Sheets

SPIN-VALVE STRUCTURE AND METHOD FOR MAKING SPIN-VALVE STRUCTURES

FIELD OF THE INVENTION

This invention relates to the structure and fabrication of magnetic devices having a spin-valve structure.

STATE OF THE ART

The giant magnetoresistance (GMR) effect is known in the art. It is of large interest for applications in magnetoresistive read and write heads and for magnetic sensors. GMR magnetic multilayers exhibit strong coupling characteristics and thus high saturation fields. A multilayer or superlattice is a multitude of ferromagnetic and antiferromagnetic layers. The ferromagnetic layers can be coupled or uncoupled.

Recently several research groups have shown that the single bath electrodeposition or electrodeposition technique, is an attractive technique for the production of GMR multilayers (W. Schwarzacher and D. S. Lashmore, Giant magnetoresistance in electrodeposited films, IEEE-Trans. Magn., 32 (1996) 3133–53). Due to the above mentioned high saturation fields, these electrodeposited/electroplated multilayers are unattractive for low field sensing. The largest sensitivity so far obtained in electrodeposited multilayers has been 0.1% per Oe (R. Hart, M. Alper, K. Attenborough and W. Schwarzacher, Giant magnetoresistance in Ni—Co—Cu/Cu superlattices electrodeposited on n-type (100) GaAs substrates, Proc. 3rd International Symposium on Magnetic Materials, Processes and Devices, Electrochem. Soc. Proc., 94 (1994) 215–221). If electrodeposition is to be considered as a suitable production technique for future magnetic field sensing devices, higher sensitivity at lower switching fields must therefore be achieved.

Electrodeposition or electroplating in the art usually takes place on a conductive seed layer, typically Cu. If this seed layer cannot be removed, problems of current shunting and signal loss occur when measuring the magnetoresistive properties of the electrodeposited or electroplated materials.

New magnetic field sensors having a spin-valve structure have been disclosed. These structures have the advantage of high magnetoresistance (MR) signals and high sensitivities at lower fields (J. C. S. Kools, Exchange-Biased Spin-Values for Magnetic Storage, IEEE Trans. Magn., 32 (1996) 3165–3184). Such combination of features is of importance for many sensing applications. The production of films, showing these effects, is usually achieved by sputtering techniques.

A spin-valve is a structure with a thin non-magnetic spacer layer sandwiched between two ferromagnetic (FM) layers, which have different coercivities. The coercivity of a magnetic material reflects the resistance to a change of the orientation of the magnetic field when a magnetic (or electric) field is externally applied. In sputtered spin-valves this can be achieved by having different layer thickness, different materials or by pinning one of the layers to an antiferromagnetic (AF) layer, leaving the other magnetic layer free to rotate. The magnetisation alignment of the ferromagnetic layers can be changed from antiparallel (high resistance state) to parallel (low resistance state) depending on the externally applied magnetic field.

A recent advance in spin-valve design used to replace the typical AF materials, e.g. FeMn or NiO, has been the implementation of an artificial or synthetic antiferromagnetic subsystem (AAF or SyAF)(H. A. M van den Berg, W. Clemens, G. Gieres, G. Rupp, W. Schelter and M. Vieth, GMR sensor scheme with artificial antiferromagnetic subsystem, IEEE Trans. Magn., 32 (1996) 4624–4626)) (J. L. Leal and M. H. Kryder, Spin-valves exchange biased by Co/Ru/Co synthetic antiferromagnets, J.Appl.Phys. 83, 3720 (1997)). These new spin-valve structures are comprised of a FM layer separated by a Cu spacer the AAF subsystem which itself consists of a few strongly coupled bilayers or multilayers such as Co/Cu bilayers or Co/Ru/Co respectively. They have an added advantage over the AF layers of improved resistance against corrosion and higher processing temperatures.

A specific spin-valve structure is disclosed in document WO98/14793.

AIMS OF THE INVENTION

A first aim of the present invention is to provide novel magnetic devices capable of high magnetoresistive signals and high sensitivities at low fields.

Another aim of the present invention is to provide a novel magnetic device of which the properties can be determined by varying its construction parameters, preferably by appropriate choice of a carrier substrate, and to provide a novel magnetic device that can be used for several purposes by varying its mode of operation.

Another aim of the present invention is to provide new magnetic memory devices that can show multi-value memory capacity.

A further aim of the present invention is to provide a novel method for producing a magnetic sensor capable of sensing high magnetoresistive signals and having high sensitivities at low fields.

Another aim of the present invention is to provide a novel low-cost fabrication method for spin-valve structures.

SUMMARY OF THE INVENTION

The present invention concerns in a first aspect a spin-valve structure comprising a first and a second free ferromagnetic layer and a spacer layer positioned between said first and second free ferromagnetic layers, and wherein said first free ferromagnetic layer is positioned on a substrate. In a preferred embodiment of the invention, said first free ferromagnetic layer is in direct contact with the surface of said substrate.

Advantageously, said spacer layer is an antiferromagnetic or metal or semimetal or conductive semiconductor layer or any combination thereof or any multiple layer structure of any of these layers.

In the free ferromagnetic layers, the orientation of the magnetic fields can be changed, preferably independently one of the other, with an externally applied electrical or magnetic field. The first and second free ferromagnetic layers, in a preferred embodiment of the present invention, can be switched at different externally applied electrical or magnetic fields. One of the free layers can have a parallel behaviour and one of the free layers can have an antiparallel behaviour.

Preferably, the spacer layer can be an artificial antiferromagnetic layer or a synthetic antiferromagnetic layer.

The artificial antiferromagnetic layer can comprise Cu layers and Co layers positioned therebetween, said Cu layers being thin enough as to increase magnetic coupling between said Co layers. These layers or any $Co_xNi_yFe_{1-x-y}$ alloy or any $Co_xFe_yX_{1-x-y}$ alloy (X being Cr, V, Ni, Cu) can act as a single hard layer.

Said first and/or second free ferromagnetic layer can comprise Co, but can also comprise NiFe or CoFe. Preferably, the first free ferromagnetic layer that is positioned on said semiconductor substrate has a higher coercivity than the other free ferromagnetic layer.

Preferably, the substrate is a semiconductor substrate. Said semiconductor substrate can be a GaAs or Ge or Si or a polymer or any other semiconducting substrate.

Said substrate can be either a semiconductor (including GaAs and Si) or any substrate that is conductive enough to allow plating but some barrier is to be formed so that in the sensing operation the sensing current does not enter the substrate. The substrate choice can also include a semiconducting polymer, or a polymer that makes a Schottky or other Barrier contact with a metal deposited thereon. In an alternative, a highly ohmic layer should be deposited first on the substrate. Thus, the ferromagnetic layer can be separated from the substrate by an insulating tunnelling barrier.

The magnetic and structural properties of said first free ferromagnetic layer can be influenced by the structure of the surface and/or the lattice structure of the semiconductor substrate on which it is positioned. Foregoing the deposition of the first free ferromagnetic layer on the substrate, a change of the semiconductor surface structure by ion bombardment or any other method may change the magnetic and structural properties of the first free ferromagnetic layer that is grown thereon.

In a preferred embodiment, there is an electrical barrier between the first free ferromagnetic layer and the semiconductor surface. Said electrical barrier can be a Schottky Barrier or a Tunnel Barrier. Such electrical barrier can be formed while depositing said first free ferromagnetic layer on said semiconductor surface and can prevent shunting currents and protect said spin-valve structure against electrostatic discharge. This barrier however is weak enough to provide electrical contact if necessary during deposition.

Said spin-valve structure can act as a magnetic memory device, preferably a magnetic memory device having more than two memory states. Said magnetic memory device can be set using current or voltage pulses of predefined magnitude and pulse width. For achieving a different memory setting, the pulses can be of a fixed magnitude and a variable pulse width, or the pulses can be of a variable magnitude and a fixed pulse width.

The present invention also relates to a spin-valve structure comprising a first and a second free ferromagnetic layers and a spacer layer, preferably an antiferromagnetic or a metal or semimetal or conductive semiconductor layer, positioned between said first and said second free ferromagnetic layers wherein said first free ferromagnetic layer is positioned on a substrate forming a barrier with a ferromagnetic layer being positioned thereon. This barrier is such that it can prevent shunting currents or other forms of electrical transport from the substrate to the magnetic layers during operation of the spin-valve structure while allowing for electrical contact if necessary during deposition of the ferromagnetic layer on the substrate. Such substrate can also be a polymer material.

Yet according to the present invention, also a spin-valve structure is disclosed, comprising a first and a second free ferromagnetic layers and an antiferromagnetic or a metal or semimetal or conductive semiconductor or insulating layer positioned between said first and said second free ferromagnetic layers, wherein said first free ferromagnetic layer is positioned on a conducting substrate with an insulating layer therebetween.

The insulating layer can be such that it is providing a barrier weak enough for having electrical transport during deposition of the first free ferromagnetic layer preferably by electroplating and high enough for confining electrical currents in the layers during operation of the spin-valve structure. During operation, the barrier is to act as a Schottky Barrier or a Tunnel Barrier or a High Ohmic Contact.

Further is disclosed, according to the present invention, a spin-valve structure comprising a first and a second free ferromagnetic layers and a spacer layer positioned between said first and said second free ferromagnetic layers, wherein said first free ferromagnetic layer is positioned on a substrate, said first free ferromagnetic layer having the same lattice structure as said substrate. Preferably, said spacer layer is one of the group of a metal layer, an antiferromagnetic layer, an insulating layer or any combination thereof or any multilayer structure of any of the layers of said group.

A second aspect of the present invention is a method for producing a spin-valve structure, comprising the step of electrodeposition or electroplating of said spin-valve structure on a substrate, preferably a semiconductor substrate. Said step of electrodeposition preferably comprises the following steps:

electrodeposition of a first ferromagnetic layer on a semiconductor substrate, electrodeposition of a spacer layer, preferably a first antiferromagnetic or metal or semimetal or conductive semiconductor layer on the first ferromagnetic layer, and electrodeposition of a second ferromagnetic layer on the antiferromagnetic layer.

According to a preferred embodiment, the method of the present invention can also comprise the steps of:

electrodeposition of a first ferromagnetic layer on a semiconductor substrate, electrodeposition of a first nonmagnetic layer on the first ferromagnetic layer, electrodeposition of an antiferromagnetic or metal or semimetal or conductive semiconductor layer on said first nonmagnetic layer, electrodeposition of a second nonmagnetic layer on the antiferromagnetic layer, electrodeposition of a second ferromagnetic layer on the second nonmagnetic layer.

Yet in another preferred embodiment of the invention, the method can comprise the steps of:

making an insulating layer on a conductive substrate, electrodepositing a first ferromagnetic layer on said insulating layer, electrodepositing a nonmagnetic layer on said first ferromagnetic layer, electrodepositing a second ferromagnetic layer on said nonmagnetic layer.

More preferably, said insulating layer is made in an electroplating step.

In a preferred embodiment, said electrodeposition steps are performed in a single electrolyte bath. Said electrolyte can comprises several elements, said elements being selected to be deposited by an applied electrodeposition voltage.

The method can further comprise a selection or a changing step of the surface structure of said semiconductor substrate prior to the electrodeposition step. The surface structure of the semiconductor substrate can be changed by ion bombardment or any other method known in the art.

A third aspect of the present invention is the advantageous use of the spin-valve structure of the present invention for a number of applications that are mentioned below.

An aspect of the invention is the use of the spin-valve structure as described herein or obtainable by the method as described herein as a sensing element for contactless position, angle and/or movement sensing.

Another aspect of the use of the present invention is the use of any spin-valve structure as described herein or obtainable by any method as described herein as a sensing element for angular position sensing.

Another aspect of the use of the present invention is the use of any spin-valve structure as described herein or obtainable by any method as described herein as a sensing element for indirect measurement of physical parameters through the change in resistance of the multilayer structure.

Another aspect of the use of the present invention is the use of any spin-valve structure as described herein or obtainable by any method as described herein as a magnetic device in a magnetic memory circuit for building a Magnetic Random Access Memory. Said magnetic device can have a multivalue magnetic memory.

Another aspect of the use of the present invention is the use of any spin-valve structure as described herein or obtainable by any method as described herein as an element of logic gates comprised in a logic device.

Another aspect of the use of the present invention is a method of operating any spin-valve structure comprising any barrier as described herein, whereby currents are confined in-plane by said barrier.

Yet another aspect of the use of the present invention is a method of operating any spin-valve structure comprising any barrier as described herein, whereby currents can cross said barrier due to increasing or decreasing the applied voltage over said barrier.

Yet any combination of any of the embodiments or aspects of the invention can be achieved and such spin-valve structures or methods of production or use will create advantageous devices. Also any of the substrates mentioned above can be an interlayer or a multitude of such interlayers of such substrate materials being deposited on a carrier substrate.

DETAILED DESCRIPTION OF SEVERAL PREFERRED EMBODIMENTS OF THE INVENTION

Figure 1:
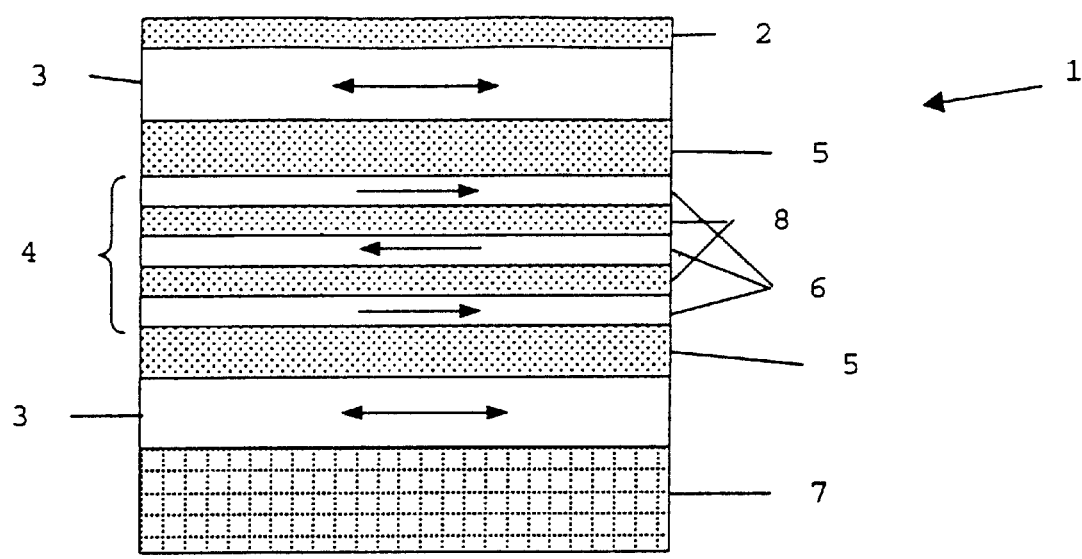
FIG. 1 describes a schematic representation of a spin-valve structure according to a preferred embodiment of the present invention.
Figure 2:
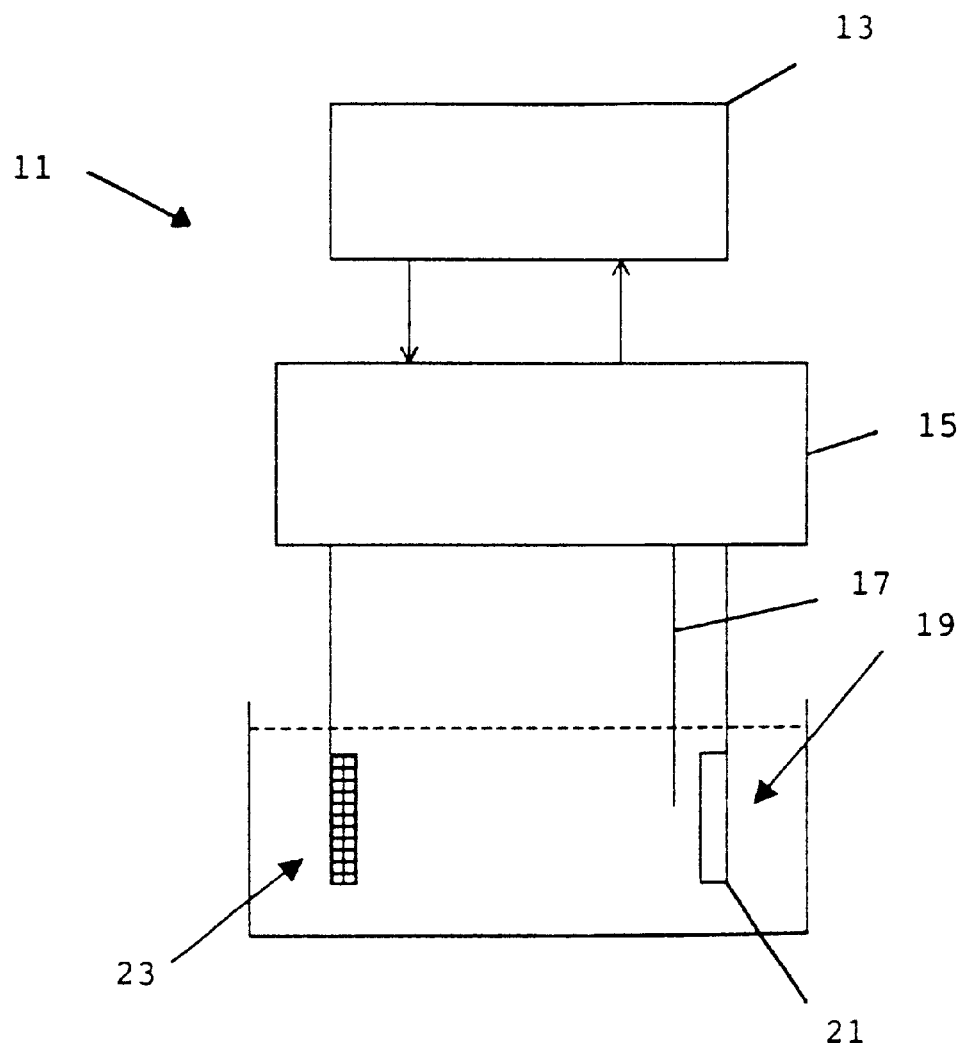
FIG. 2 shows a schematic diagram of the experimental setup used for electrodeposition.

Embodiments and examples of the invention will be described below. It is evident that the person skilled in the art will be able to imagine or make other embodiments according to the present invention, the spirit and the scope of this invention being limited only by the appended claims.

The aims of the invention are met in the present invention. A spin-valve deposited on a semiconductor substrate or any other substrate with an insulating layer between the substrate and the spin-valve results in a highly sensitive magnetic sensor. The production of a magnetic sensor can comprise the electroplating of a spin-valve structure on a substrate and can provide a sensor capable of high magnetoresistive signals and high sensitivity for low fields.

The process according to the invention thus can comprise an electrodeposition step. Electrodeposition usually takes place on a conductive seed layer, typically Cu. If this seed layer cannot be removed, problems of current shunting and signal loss occur when measuring the magnetoresistive properties of the electrodeposits when the sensor is in operation. To avoid this problem, the spin-valves are grown on a substrate, which eliminates the current shunting through the formation of a barrier at the ferromagnetic/substrate interface.

Preferably, a single bath electrodeposition technique is used.

Since in the case of the single bath electrodeposition technique one is restricted to layers consisting of elements present in the electrolyte, the implementation of an AAF subsystem is a viable option in order to produce electrodeposited spin-valve structures.

Substrate Choice for Electrodeposition

The spin-valve structure can be grown on a number of substrates. The substrate is to be conductive enough to allow plating but some barrier (Tunnel Barrier, Schottky Barrier or Highly Resistive Layer) should be formed so that in the sensing operation, the sensing current does not enter the substrate.

Said substrate can be either a semiconductor (including GaAs and Si) or any substrate that is conductive enough to allow plating but some barrier is to be formed so that in the sensing operation the sensing current does not enter the substrate. The substrate choice can also include a semiconducting polymer, or a polymer that makes a Schottky or other Barrier contact with a metal deposited thereon. In an alternative, a highly ohmic layer could be deposited first on the substrate.

The approach of growing a spin-valve structure on a substrate with a barrier therebetween solves the problem of large shunting currents in the structure. The barrier contact further allows several modes of operation, depending on the voltage applied over the barrier contact, since current will only flow over the barrier contact for certain voltage ranges. It is possible to electrodeposit or to electroplate such a barrier contact layer as a highly resistive layer, for example a resistive layer including insulating or highly resistive particles.

The barrier has another advantage in specific cases where it can prevent a large current to go through the spin-valve by deviating it into the substrate, hence offering an added feature in the design of spin-valve components by reducing the problem of breakdown or permanent failure due to transients such as Electrostatic Discharge or spikes on power and ground lines in circuits.

It is apparent to the person skilled in the art that the typical resistance in the metallic layers of the spin-valve structure are of the order of milliohms or ohms. A barrier contact between the substrate and the spin-valve such as a schottky barrier can have a contact resistance of the order of Kiloohms or Megaohms.

The semiconductor substrate GaAs is used as an example in the best mode description described below. This substrate provides a barrier contact between the metallic multilayer and the substrate. The growth on a semiconductor has other advantages. Through the difference of the substrate structure and/or surface conditions in comparison to Cu or other standard template layers, the structural properties and the magnetic anisotropy properties of the magnetic film in contact with the semiconductor substrate are different. This cancels the need for an additional pinning layer or other additional metal to change the magnetic properties. The structure (and thus the coercivity) of the ferromagnetic layer that is positioned directly on the semiconductor surface can be influenced by the structure of the substrate and by the condition of the surface of the substrate (for instance roughness or lattice). Even the use of a magnetic field during deposition can be avoided. Hence the semiconductor substrate is clearly determining some of the important properties of the sensing element.

Method of Deposition and Sub-micron Structures Without Seeding/template Layer and Without the Need for Subtractive Etching or Lift-off: Method of Growing the Spin-valve Structure The voltage for the deposition is to be high enough to ensure carrier transport through/across the insulating barrier. In sensing operation, the sense current through the magnetic element structure is not entering the semiconductor substrate because of the lower voltage applied across the barrier.

The electrodeposition can provide sub-micron structures without the need for subtractive etching or lift-off processes. When electrodepositing on the semiconducting substrate into a cavity, there is no need for a sacrificial layer and the cavity will be filled from the bottom up. This overcomes the problem of side-wall growth which may lead to void formation or at least a loss of the layer-by-layer growth, which is essential for spin-valve elements.

Description of a Spin-valve Structure and of the Production Process of a Spin-valve Structure According to a Preferred Embodiment of the Invention A device according to a preferred embodiment of the present invention is described below according to the features of FIG. 1.

The chosen sensor structure (1), deposited on a GaAs substrate (7) consists of two so-called free layers of 10 nm Co (3) sandwiched around an AAF subsystem (4) by two 4.8 nm Cu uncoupling layers (5). The AAF subsystem (4) consists of three 2.7 nm Co layers (6) separated by Cu spacer layers (8). To increase the coupling between these Co layers (6), the thickness of the Cu spacer layers (8) has to be very thin, in our case, 3.2 nm. Finally, the structure is capped with a 4 nm Cu layer (2) to prevent oxidation of the top Co layer.

Thus a symmetric variant spin-valve structure is used, having two free ferromagnetic layers sandwiched around a AAF subsystem, with a thicker Cu spacer layer being used to uncouple the free ferromagnetic layers from the subsystem.

In this case the thickness of the spacing Cu layers inside the AAF is enlarged so as to reduce the coupling in the magnetic sublayers of multilayer. In this case the characteristics of a hard ferromagnet are achieved. The advantages of using an AAF (or a SyAF) in terms of corrosion resistance and processing temperatures are preserved.

Rectangular pieces are cut from an n-type (100)-GaAs substrate (Si doped $10^{18}$ cm$^{-3}$, from AXT). Electrical contact is made via an ohmic contact to the back of the wafer pieces and the edges are covered with Kapton tape to prevent solution leakage during the pre-cleaning steps and the electrodeposition.

Prior to electrodeposition, native oxides are removed from the GaAs surface by pretreatment in an $NH_3$ solution followed by rinsing in deionised water. The substrate is directly placed into a sulfate electrolyte (19), containing Co and Cu ions (see S. K. J. Lenczowski, C. Schoenenberger, M. A. M. Gijs, W. J. M. de Jonge, Giant magnetoresistance of electrodeposited Co/Cu multilayers; J. Magn. Mat., 148 (1995) 455–65). Deposition experiments are performed at room temperature and pH 3.3. Other temperatures and pH values can be used as well. A standard three electrode plating cell (11) is used with Ag/AgCl as the reference electrode (17), Pt as a counter electrode (23) and the substrate as the working electrode (21). All electrode potentials quoted below are measured with respect to the reference electrode. Since each metal ion has its own characteristic deposition potential it is possible to control the composition of the electrodeposited layers by choosing the appropriate potential provided by a potentiostat (15). In the present case, −0.55 V was used to deposit pure copper and −1.1 V for the deposition of the magnetic Co-based layer. The deposition process was computer controlled (13) enabling the current flowing through the circuit to be monitored and integrated. When a chosen potential is applied to the substrate, a charge flows through the circuit which determines, via Faraday's law, the thickness of the deposit depending on the exposed deposition area. Once the charge corresponding to the desired thickness has been reached, the potential is automatically switched to deposit the next layer.

Figure 3:
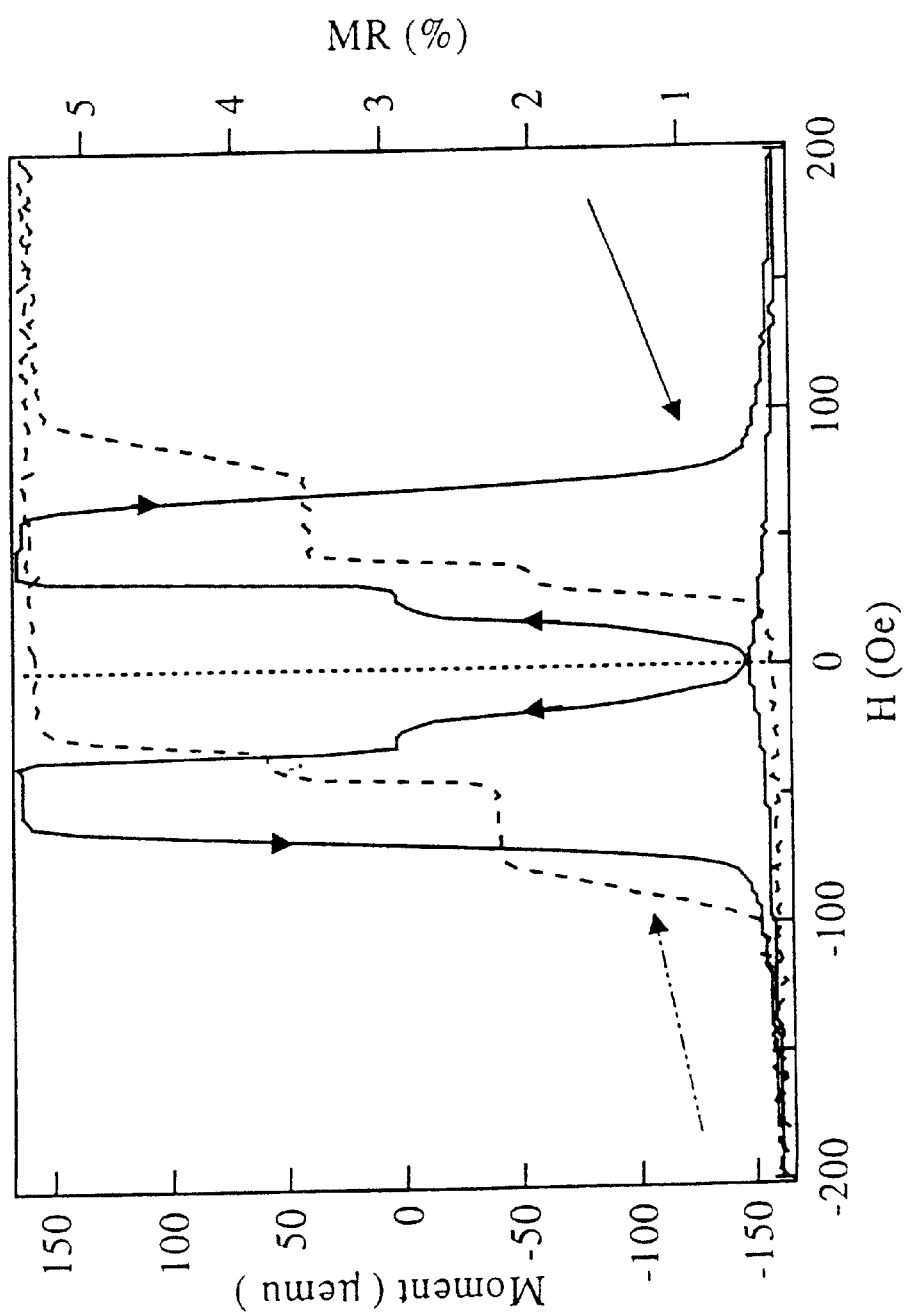
FIG. 3 discloses the magnetoresistance and hysteresis loop, measured at 450, as a function of applied field for an electrodeposited spin-valve structure.

Properties of the Spin-valve Structure According to the Preferred Embodiment of the Invention Magnetoresistive properties of the spin-valve sensor structure as disclosed in the preferred embodiment above are measured. Magneto-transport properties can be measured using a 4-point probe in a D.C. configuration up to 1.7 kOe and an alternating gradient field magnetometer (AGFM) can be used to measure the magnetisation curves of the spin-valves. All measurements are performed at room temperature. A magnetoresistance (MR) (full line) as well as the corresponding hysteresis curve (dotted line) of this spin-valve are shown in FIG. 3. These curves are measured under an angle of 45° with respect to the preferential crystal orientation of the GaAs ([110] orientation). The magnetoresistance curve shows three almost discrete resistance levels as a function of the magnetic field, which corresponds to well defined magnetisation configurations in the multilayer structure, as can be seen in the hysteresis behaviour at those particular fields. This can be explained as follows.

Starting from saturation (+200 Oe) the magnetic field is decreased and as long as the alignment between the ferromagnetic layers is not altered, the resistance remains constant. At around−26 Oe the resistance abruptly increases which is due to one of the Co free ferromagnetic layers switching at that field. This field corresponds to coercive field of the top free ferromagnetic layer whose magnetisation is now antiferromagnetically aligned, i.e. anti-parallel, with the magnetisation of the middle structure 4. This can be better understood by taking into account the different contributions of the ferromagnetic layers in the total magnetisation for this particular field, for which a strong decrease can be observed in the hysteresis behaviour. The sensitivity of the magnetoresistance during this transition corresponds to 0.32%/Oe. When the second free ferromagnetic layer is switching, the MR ((Rmax-Ro)/Ro) reaches its maximum value of 5.4% at around −37 Oe, Which corresponds to a sensitivity of 0.55%/Oe. A rather broad plateau region in both curves ranges from −37 to −58 Oe. Upon decreasing the magnetic field further, the resistance decreases and becomes saturated at around −100 Oe.

If the substructure were a true AAF structure then one would expect to see a long tail in the magnetisation response. Since this is not present, the inner layers are not strongly AF coupled but are acting as a 'single' hard layer. Thus, the field at which the MR reaches saturation corresponds to the mean coercive field of this artificially hard layer.

The structure thus described can be visualised as two simple spin-valves which are equally contributing to a higher total magnetoresistance effect, as the number of spin-dependent scattering interfaces is doubled while the influence of spin-independent outer boundary scattering is reduced.

Figure 4:
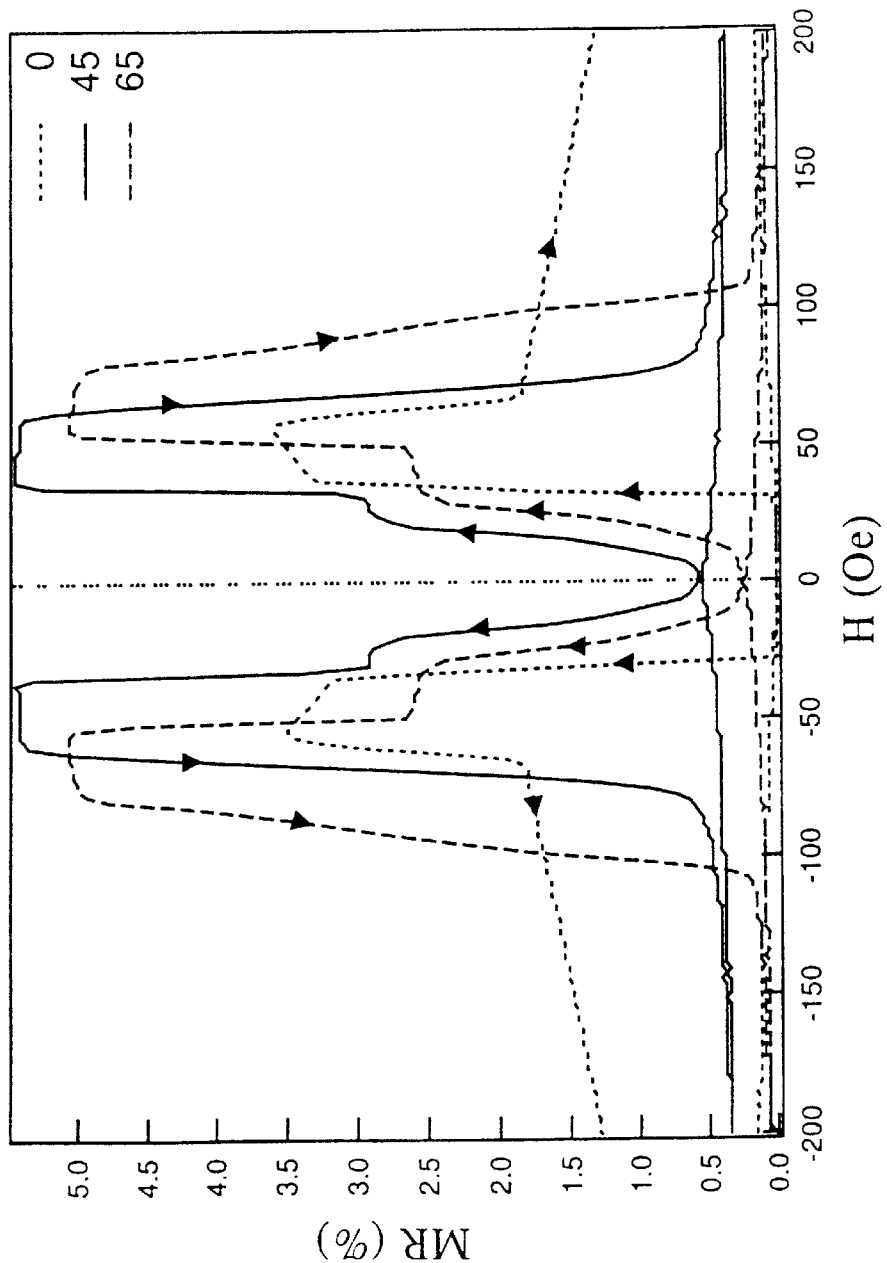
In FIG. 4, magnetoresistance curves measured at angles of 0°, 45°, 65° with respect to the preferential crystal orientation in GaAs is shown.

It can also be observed that the GMR peak positions, size and sensitivity of the films strongly varies with the angular positioning of the measurement sample within the magnetic field and some typical examples of this are shown in FIG. 4. The highest sensitivity reached so far is 0.67% per Oe. This angular dependence of the MR is evidence of a strong in-plane anisotropy, which might be one of the factors responsible for the unique spin-valve properties of these films. These properties also indicate that the presented spin-valve structure is suitable for sensor implementation.

The step that can be observed in the MR is caused by the difference in coercive field between both free ferromagnetic layers.

The possible explanations for the difference in coercivity are:

Structure of the layer on the substrate (grain size)

Magnetic anisotropy induced by the semiconductor

Gradient in Cu-content of the subsequent Co layers

Accordingly these coercivities can be tailored and such therefore opens up many more possibilities for sensor application. For example, if both plateau regions are expanded, e.g. the curve recorded at 65°, a multi-value memory element could be realised.

On the other hand, by matching the coercivities, a monotonous response of MR with field is possible and such will dramatically increase the sensitivity of these structures, i.e., normal spin-valve behaviour.

Use of the Spin-valve Structure of the Present Invention

The spin-valve structure according to the invention can be used as:

A sensing element for contactless position, angle and movement sensing

A sensing element for angular position sensing

A sensing element for indirect measurement of other physical parameters through the change in resistance of the multilayer structure.

A sensing element with increased resistance against overvoltage or over-current breakdown.

A magnetic memory element in a magnetic memory circuit for building a Magnetic Random Access memory with ultra-small magnetic bits.

A logic device where the magnetic devices fabricated using the disclosed details are used in the logic (latching) gates. The artificial hard ferromagnet structure has certain advantages for the fabrication of re-configurable logic to be used in Neural Nets and other future applications, where magnetic devices are already claimed to be useful.

The quick transition to the fully aligned state (high sensitivity of the structure in this field range) adds another advantage when such elements are intended for use in latching devices (sensing elements with memory or threshold detection functions) and reconfigurable logic gates. Further, the number of plateaus in the MR curve can be tailored to achieve a chosen logic function for a chosen number of inputs. The inputs will typically be current-pulses of a predefined magnitude and pulse-width, sent through a conductor which is inductively coupled to the magnetic element(s) in the gate-cell. The multiple values of the magnetic memory element can correspond to current-pulse magnitude (fixed pulse-width) or current-pulse width (fixed magnitude) values.

The magnetic elements according to the present invention can also be used as tuneable resistors with memory function for all applications where changing the value of a resistor can change the functioning of a circuit such as in the feedback of an Opamp, tuning of filters or oscillators, or MMIC circuits with integrated resistors to replace or to be integrated together with existing high precision resistors like NiCr. The tuning can be done with an external magnetic field and retains its value due to the built-in hysteresis of the magnetic element. In the case of soft magnetic materials, it can also be done with integrated current-lines, to bias the sensing elements. Self-biasing in the case of spin-valves must be taken into account (current in the spin-valve changes the magnetisation state and hence also the resistance value). This effect can be used to detect maximum values of currents.

We claim:

1. A spin-valve structure comprising:

a first free ferromagnetic layer; and a second free ferromagnetic layer; and a spacer layer positioned between said first and second free ferromagnetic layers, wherein said first free ferromagnetic layer is positioned on a conducting substrate with barrier layer in between; and wherein said barrier layer provides an electrical barrier weak enough to allow electrical transport during electroplating of one or more of the first free ferromagnetic layer, the spacer layer and the second free ferromagnetic layer, and high enough to confine electrical currents in the first and second free ferromagnetic layers during operation of the spin-valve structure.

2. The spin-valve structure as recited in claim 1, wherein said barrier layer comprises a tunnel barrier layer.

3. The spin-valve structure as recited in claim 1, wherein said spacer layer comprises one or more sub-layers, each of the one or more sub-layers being selected from the group consisting of a metal layer, an antiferromagnetic layer, an insulating layer, a semimetal layer and a conductive semiconductor layer.

4. A spin-valve structure comprising:

a first free ferromagnetic layer;

a second free ferromagnetic layer; and a third layer positioned between said first and second free ferromagnetic layers, wherein said third layer comprises a layer selected from the group consisting of an antiferromagnetic layer, a metal layer, a semimetal layer and a conductive semiconductor layer;

wherein said first free ferromagnetic layer is positioned on a substrate that forms an electrical barrier with the first free ferromagnetic layer, wherein electrical transport occurs between the substrate and the spin-valve structure during electro-deposition of the spin-valve structure on the substrate.

5. The spin-valve structure as recited in claim 4, wherein substrate is a semiconductor substrate.

6. The spin-valve structure as recited in claim 5, wherein said first free ferromagnetic layer is in direct contact with said semiconductor substrate.

7. The spin-valve structure as recited in claim 5, wherein said semiconductor substrate is a substrate selected from the group consisting of a GaAs substrate, a Si substrate, a Ge substrate, and a SiGe substrate.

8. The spin-valve structure as recited in claim 5, wherein the first free ferromagnetic layer that is positioned on said semiconductor substrate has a different coercivity than the second free ferromagnetic layer.

9. The spin-valve structure as recited in claim 5, wherein the first free ferromagnetic layer that is positioned on said semiconductor substrate has a different anisotropy than the second free ferromagnetic layer.

10. The spin-valve structure as recited in claim 9, wherein the first free ferromagnetic layer that is positioned on said semiconductor substrate has a different coercivity than the second free ferromagnetic layer.

11. The spin-valve structure as recited in claim 5, wherein the first free ferromagnetic layer that is positioned on said semiconductor substrate has a higher coercivity than the second free ferromagnetic layer.

12. The spin-valve structure as recited in claim 5, wherein the semiconductor substrate defines a surface, and wherein magnetic and structural properties of said first free ferromagnetic layer are influenced by conditions of the surface of the semiconductor substrate.

13. The spin-valve structure as recited in claim 12, wherein the substrate defines a structure, and wherein the magnetic and structural properties of said first free ferromagnetic layer are influenced by the structure of said substrate.

14. The spin-valve structure as recited in claim 5, wherein the semiconductor substrate defines a lattice structure, and wherein magnetic and structural properties of said first free ferromagnetic layer are influenced by the lattice structure of the semiconductor substrate.

15. The spin-valve structure as recited in claim 4, wherein between said first and second free ferromagnetic layers, there is a sequence of layers comprising at least two magnetic layers with a nonmagnetic layer therebetween.

16. The spin-valve structure as recited in claim 4, wherein between said first and second free ferromagnetic layers, there is a layer selected from the group consisting of an artificial antiferromagnetic layer and a synthetic antiferromagnetic layer.

17. The spin-valve structure as recited in claim 4, wherein said first free ferromagnetic layer comprises a material selected from the group consisting of Co, NiFe and CoFe or a mixture thereof.

18. The spin-valve structure as recited in claim 4, wherein said second free ferromagnetic layer comprises a material selected from the group consisting of Co, NiFe and CoFe or a mixture thereof.

19. The spin-valve structure as recited in claim 18, wherein said first free ferromagnetic layer comprises a material selected from the group consisting of Co, NiFe and CoFe or a mixture thereof.

20. The spin-valve structure as recited in claim 4, wherein the substrate defines a structure, and wherein magnetic and structural properties of said first free ferromagnetic layer are influenced by the structure of said substrate.

21. The spin-valve structure as recited in claim 4, wherein the electrical barrier comprises a Schottky barrier.

22. The spin-valve structure as recited in claim 21, wherein said electrical barrier prevents shunting currents and protects said spin-valve structure against electrostatic discharge during operation of the spin-valve structure.

23. The spin-valve structure as recited in claim 4, wherein said third layer comprises an antiferromagnetic layer, and wherein said antiferromagnetic layer comprises Cu layers and Co layers positioned therebetween, said Cu layers being thin enough to increase magnetic coupling between said Co layers.

24. The spin-valve structure as recited in claim 23, wherein the layers of said antiferromagnetic layer act as a single hard layer.

25. The spin-valve structure as recited in claim 4, wherein said spin-valve structure is a part of a magnetic memory device.

26. The spin-valve structure as recited in claim 25, wherein said magnetic memory device has more than two memory states.

27. The spin-valve structure as recited in claim 25, wherein said magnetic memory device has means for being programmed using current pulses of predefined magnitude and pulse width.

28. The spin-valve structure as recited in claim 27, wherein said current pulses are of a fixed magnitude and a variable pulse width.

29. The spin-valve structure as recited in claim 27, wherein said current pulses are of a variable magnitude and a fixed pulse width.

30. A magnetic memory device comprising a spin-valve structure as recited in claim 4.

31. The magnetic memory device as recited in claim 30 having more than two memory states.

32. The magnetic memory device as recited in claim 30, further comprising means for being programmed using current pulses of predefined magnitude and pulse width.

33. The magnetic memory device as recited in claim 32, wherein said current pulses are of a fixed magnitude and a variable pulse width.

34. The magnetic memory device as recited in claim 32, wherein said current pulses are of a variable magnitude and a fixed pulse width.

* * * * *

UNITED STATES PATENT AND TRADEMARK OFFICE
CERTIFICATE OF CORRECTION

PATENT NO.   : 6,721,141 B1
DATED        : April 13, 2003
INVENTOR(S)  : Attenborough et al.

It is certified that error appears in the above-identified patent and that said Letters Patent is hereby corrected as shown below:

<u>Column 10,</u>
Line 8, please correct to read -- said substrate barrier --
Line 43, please correct to read -- with a barrier layer in between --

Signed and Sealed this

Twenty-ninth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,721,141 B1
DATED : April 13, 2003
INVENTOR(S) : Attenborough et al.

It is certified that error appears in the above-identified patent and that said Letters Patent is hereby corrected as shown below:

Column 10,
Line 8, please correct to read -- advantage when such elements are intended for use in --
Line 43, please correct to read -- with a barrier layer in between, --

Column 11,
Line 8, please correct to read -- said substrate barrier is a semiconductor substrate. --

Signed and Sealed this

Twenty-fourth Day of August, 2004

JON W. DUDAS
*Director of the United States Patent and Trademark Office*